«12» United States Patent
Shimizu et al.

（10）Patent No.: US 12,171,067 B2
（45）Date of Patent: Dec. 17, 2024

（54）METHOD OF MANUFACTURING PRINTED WIRING BOARD

（71）Applicant: MITSUI MINING & SMELTING CO., LTD., Tokyo (JP)

（72）Inventors: Yoshinori Shimizu, Ageo (JP); Hiroto Iida, Ageo (JP); Misato Mizoguchi, Ageo (JP); Akitoshi Takanashi, Ageo (JP); Makoto Hosokawa, Ageo (JP)

（73）Assignee: MITSUI MINING & SMELTING CO., LTD., Tokyo (JP)

( * )Notice: Subject to any disclaimer, the term of this patent is extended or adjusted under 35 U.S.C. 154(b) by 529 days.

（21）Appl. No.: 17/442,355

（22）PCT Filed: Mar. 17, 2020

（86）PCT No.: PCT/JP2020/011792
§ 371 (c)(1),
(2) Date: Sep. 23, 2021

（87）PCT Pub. No.: WO2020/196106
PCT Pub. Date: Oct. 1, 2020

（65）Prior Publication Data
US 2022/0183158 A1    Jun. 9, 2022

（30）Foreign Application Priority Data

Mar. 26, 2019   (JP) .................................. 2019-058722

（51）Int. Cl.
*H05K 3/06*    (2006.01)
*C23C 18/16*   (2006.01)
(Continued)

（52）U.S. Cl.
CPC ......... *H05K 3/064* (2013.01); *C23C 18/1646* (2013.01); *C23C 18/1689* (2013.01);
(Continued)

（58）Field of Classification Search
None
See application file for complete search history.

（56）References Cited

U.S. PATENT DOCUMENTS

2017/0042036 A1*  2/2017  Miyamoto ............. H05K 1/115

FOREIGN PATENT DOCUMENTS

JP        2012-033642          2/2012
JP        2012033642 A    *    2/2012
(Continued)

*Primary Examiner* — Stephanie P Duclair
(74) *Attorney, Agent, or Firm* — GREENBLUM & BERNSTEIN P.L.C.

（57）ABSTRACT

There is provided a method for manufacturing a printed wiring board that effectively suppresses pattern failure and is also excellent in fine circuit forming properties. This method includes: providing an insulating substrate including a roughened surface; performing electroless plating on the roughened surface of the insulating substrate to form an electroless plating layer less than 1.0 μm thick having a surface having an arithmetic mean waviness Wa of 0.10 μm or more and 0.25 μm or less and a valley portion void volume Vvv of 0.010 $\mu m^3/\mu m^2$ or more and 0.028 $\mu m^3/\mu m^2$ or less; laminating a photoresist on the surface of the electroless plating layer; performing exposure and development to form a resist pattern; applying electroplating to the electroless plating layer; stripping the resist pattern; and etching away an unnecessary portion of the electroless plating layer to form a wiring pattern.

7 Claims, 10 Drawing Sheets

(51) Int. Cl.
*C25D 5/02* (2006.01)
*G03F 7/16* (2006.01)
*H05K 3/46* (2006.01)

(52) U.S. Cl.
CPC ............... *C25D 5/022* (2013.01); *G03F 7/16* (2013.01); *H05K 3/4661* (2013.01); *H05K 2203/0502* (2013.01)

(56) References Cited

FOREIGN PATENT DOCUMENTS

| | | |
|---|---|---|
| JP | 2017-038043 | 2/2017 |
| WO | 2016/158775 | 10/2016 |
| WO | 2018/211951 | 11/2018 |

\* cited by examiner

METHOD OF MANUFACTURING PRINTED WIRING BOARD

TECHNICAL FIELD

The present invention relates to a method for manufacturing a printed wiring board.

BACKGROUND ART

With miniaturization and densification required of printed wiring boards in recent years, the miniaturization (fine pitch) of circuits has been required. As a process for manufacturing a printed wiring board suitable for the miniaturization of a circuit, a semi-additive process (SAP) is widely adopted. The SAP is a method suitable for forming an extremely fine circuit, and as one example thereof, the SAP is performed using a carrier-attached roughening-treated copper foil. For example, as shown in FIGS. 10 and 11, a roughening-treated copper foil 110 is pressed and adhered to an insulating resin substrate 111 including a lower layer circuit 111b on a base substrate 111a, using a prepreg 112 and a primer layer 113 (step (a)), and a carrier (not shown) is released, and then a via hole 114 is formed by laser drilling as needed (step (b)). Then, the roughening-treated copper foil 110 is etched away to expose the primer layer 113 provided with the roughened surface profile (step (c)). Electroless copper plating 115 is applied to this roughened surface (step (d)), and then the electroless copper plating 115 is masked in a predetermined pattern by exposure and development using a dry film 116 (step (e)), and electric copper plating 117 is applied (step (f)). The dry film 116 is removed to form wiring portions 117a (step (g)), and then the unnecessary electroless copper plating 115 between neighboring wiring portions 117a and 117a is etched away (step (h)) to obtain wiring 118 formed in the predetermined pattern.

In the SAP using a roughening-treated copper foil in this manner, the roughening-treated copper foil itself is etched away after laser drilling (step (c)). The uneven shape of the roughening-treated surface of the roughening-treated copper foil is transferred to the laminate surface from which the roughening-treated copper foil is removed, and therefore the adhesion between the insulating layer (for example, the primer layer 113, or the prepreg 112 when the primer layer 13 is absent) and the plating circuit (for example, the wiring 118) can be ensured in subsequent steps. However, the surface profile suitable for increasing the adhesion to the plating circuit tends to have generally coarse unevenness, and therefore the etchability for the electroless copper plating is likely to decrease in step (h). In other words, more etching is required to eliminate the residual copper, by the amount that the electroless copper plating bites into the coarse unevenness.

Therefore, methods are proposed in which by making roughening particles small and allowing them to have a constricted shape, good etchability can be achieved, while necessary plating circuit adhesion is ensured, when the roughening-treated copper foil is used in the SAP. For example, Patent Literature 1 (WO2016/158775) discloses a roughening-treated copper foil having a roughening-treated surface on at least one side, wherein the roughening-treated surface includes a plurality of generally spherical protrusions composed of copper particles, and the average height of the generally spherical protrusions is 2.60 µm or less. Patent Literature 2 (WO2018/211951) discloses a roughening-treated copper foil having a roughening-treated surface on at least one side, wherein the roughening-treated surface includes primary roughening particles having a constricted portion and secondary roughening particles on the primary roughening particle surfaces, and the roughening-treated surface has low roughness, a ten-point average roughness Rz of 1.7 µm or less.

CITATION LIST

Patent Literature

Patent Literature 1: WO2016/158775
Patent Literature 2: WO2018/211951

SUMMARY OF INVENTION

With further miniaturization of a circuit required for the SAP in recent years, it is considered to provide an insulating substrate with a roughened surface profile by use of a copper foil whose surface is smooth with small roughening particles as described above, in order to achieve excellent etchability. In addition, it is convenient if electroless plating can be thinly (for example, less than 1.0 µm) applied to the surface of the insulating substrate provided with the roughened surface profile, because the amount of etching can be reduced to promote further miniaturization of a circuit. However, it has been found that the SAP, where a copper foil whose surface is smooth with small roughening particles is used and electroless plating is thinly applied to attempt circuit formation, may cause a problem of pattern failure such as the occurrence of a short circuit or raised portions in the formed circuit.

The present inventors have now found that by applying electroless plating to an insulating substrate including a roughened surface to form an electroless plating layer less than 1.0 µm thick having predetermined surface parameters, it is possible to provide a method for manufacturing a printed wiring board that effectively suppresses pattern failure and is also excellent in fine circuit forming properties.

Therefore, it is an object of the present invention to provide a method for manufacturing a printed wiring board that effectively suppresses pattern failure and is also excellent in fine circuit forming properties.

According to an aspect of the present invention, there is provided a method for manufacturing a printed wiring board, comprising the steps of:

(a) providing an insulating substrate comprising a roughened surface;
(b) performing electroless plating on the roughened surface of the insulating substrate to form an electroless plating layer less than 1.0 µm thick having a surface having an arithmetic mean waviness Wa of 0.10 µm or more and 0.25 µm or less as measured in accordance with JIS B0601-2001 and a valley portion void volume Vvv of 0.010 µm$^3$/µm$^2$ or more and 0.028 µm$^3$/µm$^2$ or less as measured in accordance with ISO 25178;
(c) laminating a photoresist on the surface of the electroless plating layer;
(d) performing exposure and development on the photoresist to form a resist pattern;
(e) applying electroplating to the electroless plating layer via the resist pattern;
(f) stripping the resist pattern; and
(g) etching away an unnecessary portion of the electroless plating layer exposed by stripping of the resist pattern, to form a wiring pattern.

DESCRIPTION OF EMBODIMENT

Definitions

The definitions of parameters used for specifying the present invention are shown below.

"Arithmetic mean waviness Wa" herein is the arithmetic mean height of a waviness curve as a contour curve at reference length measured in accordance with JIS B0601-2001. The waviness curve does not represent fine unevenness represented by a roughness curve but unevenness on a larger scale (that is, waviness). The arithmetic mean waviness Wa can be calculated by measuring the surface profile of a predetermined measurement length (for example, a one-dimensional region of 64.124 μm) on a roughened surface by a commercially available laser microscope.

"Kurtosis Sku" herein is a parameter that represents the sharpness of height distribution measured in accordance with ISO 25178, and is also referred to as peakedness. Sku=3 means that the height distribution is a normal distribution. Sku>3 means that there are many sharp peaks and valleys on a surface. Sku<3 means that the surface is flat. The kurtosis Sku can be calculated by measuring the surface profile of a predetermined measurement area (for example, a two-dimensional region of 6811.801 μm$^2$) on a roughened surface by a commercially available laser microscope.

"Maximum height Sz" herein is a parameter that represents the distance from the highest point to the lowest point of a surface measured in accordance with ISO 25178. The maximum height Sz can be calculated by measuring the surface profile of a predetermined measurement area (for example, a two-dimensional region of 6811.801 μm$^2$) on a roughened surface by a commercially available laser microscope.

Figure 7:
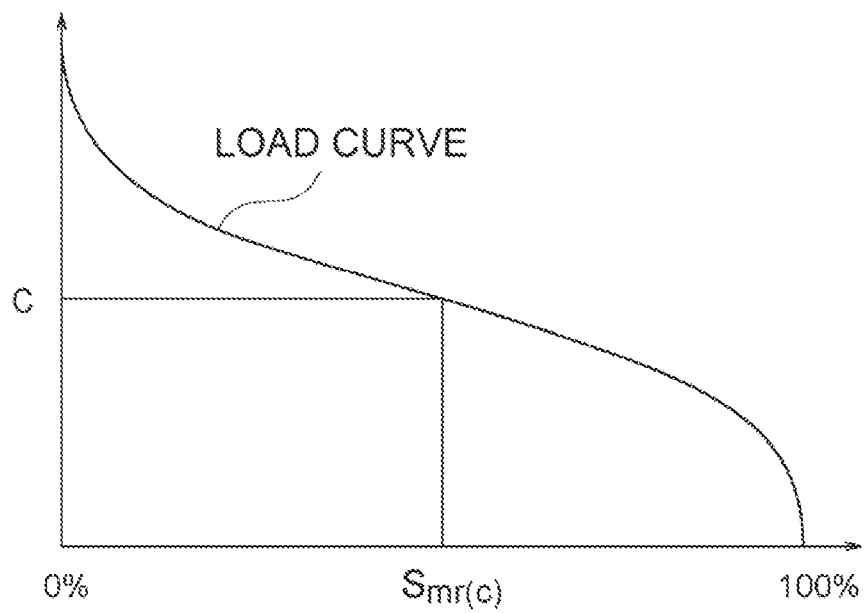
FIG. 7 is a diagram for explaining a load curve and a load area ratio determined in accordance with ISO 25178.
Figure 8:
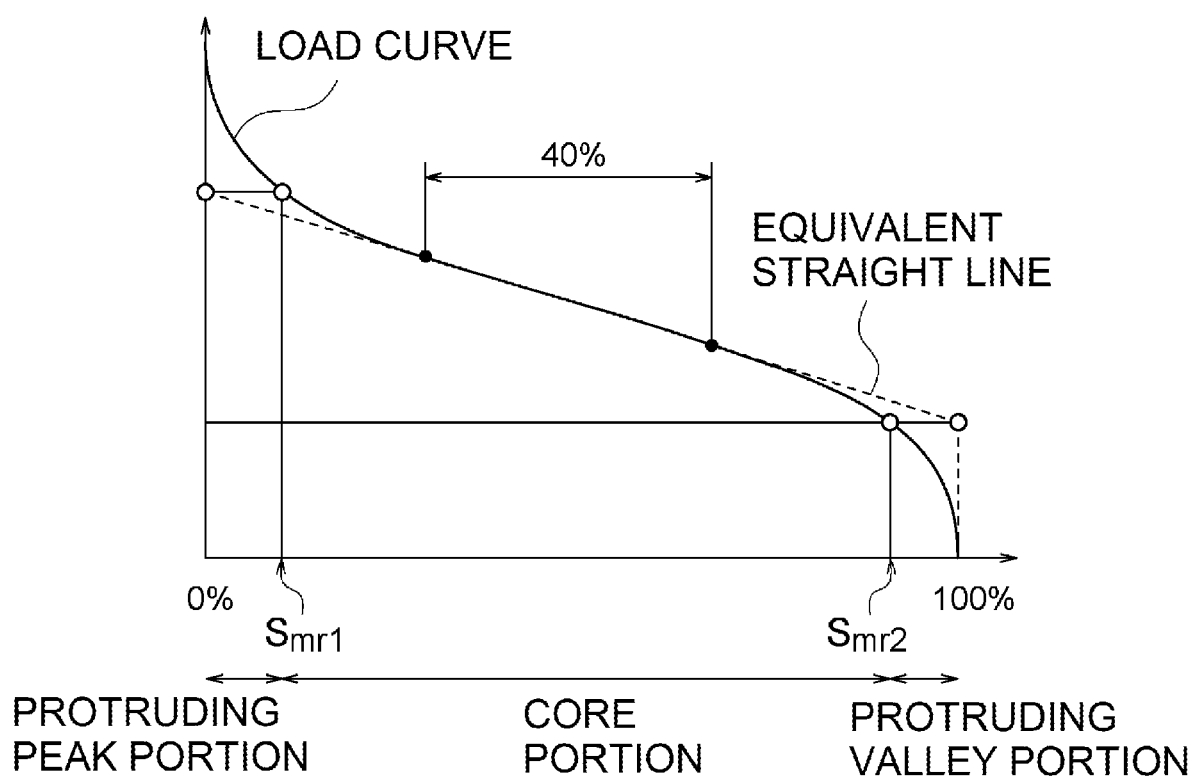
FIG. 8 is a diagram for explaining a load area ratio that separates a protruding valley portion and a core portion, Smr2, determined in accordance with ISO 25178.

"The load curve of a surface" (hereinafter simply referred to as a "load curve") herein refers to a curve that represents the height at which the load area ratio measured in accordance with ISO 25178 is 0% to 100%. The load area ratio is a parameter that represents the area of a region having a certain height c or more, as shown in FIG. 7. The load area ratio at the height c corresponds to Smr(c) in FIG. 7. As shown in FIG. 8, a secant to a load curve drawn from a load area ratio of 0% along the load curve with the difference in the load area ratio being 40% is moved from a load area ratio of 0%, and the position at which the slope of the secant is gentlest is referred to as the central portion of the load curve. The straight line for which the sum of squares of deviations in the vertical axis direction is minimal with respect to this central portion is referred to as an equivalent straight line. The portion included in the range of heights at load area ratios of 0% to 100% for the equivalent straight line is referred to as a core portion. The portion higher than the core portion is referred to as a protruding peak portion, and the portion lower than the core portion is referred to as a protruding valley portion. The core portion represents the height of a region that comes into contact with another object after initial abrasion is completed. "A load area ratio that separates a protruding valley portion and a core portion, Smr2" herein is a parameter that represents a load area ratio at the intersection point of the height of the lower portion of a core portion and a load curve (that is, a load area ratio that divides a core portion and a protruding valley portion) measured in accordance with ISO 25178, as shown in FIG. 8. It is meant that as this value becomes larger, the proportion of the protruding valley portion becomes larger.

Figure 9:
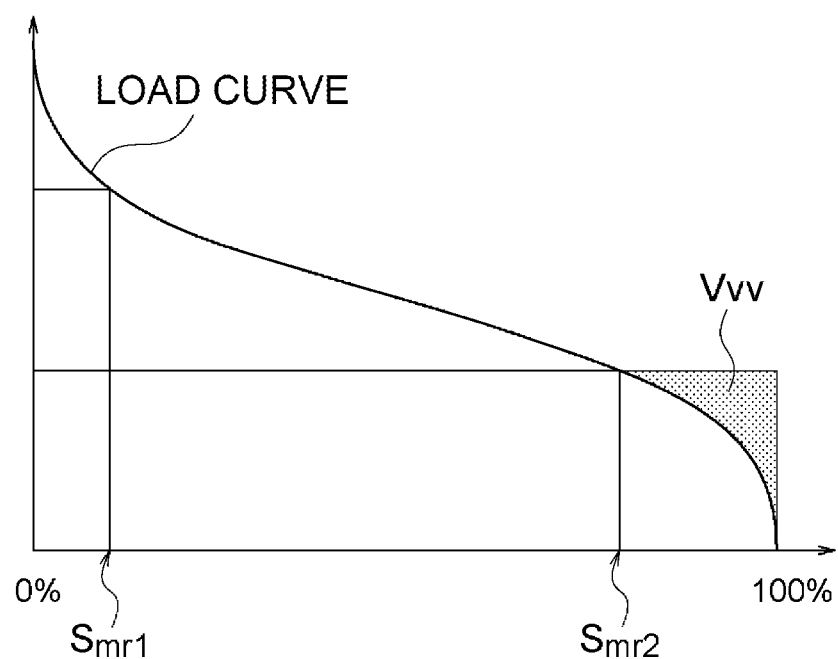
FIG. 9 is a diagram for explaining valley portion void volume Vvv determined in accordance with ISO 25178.
Figure 10:
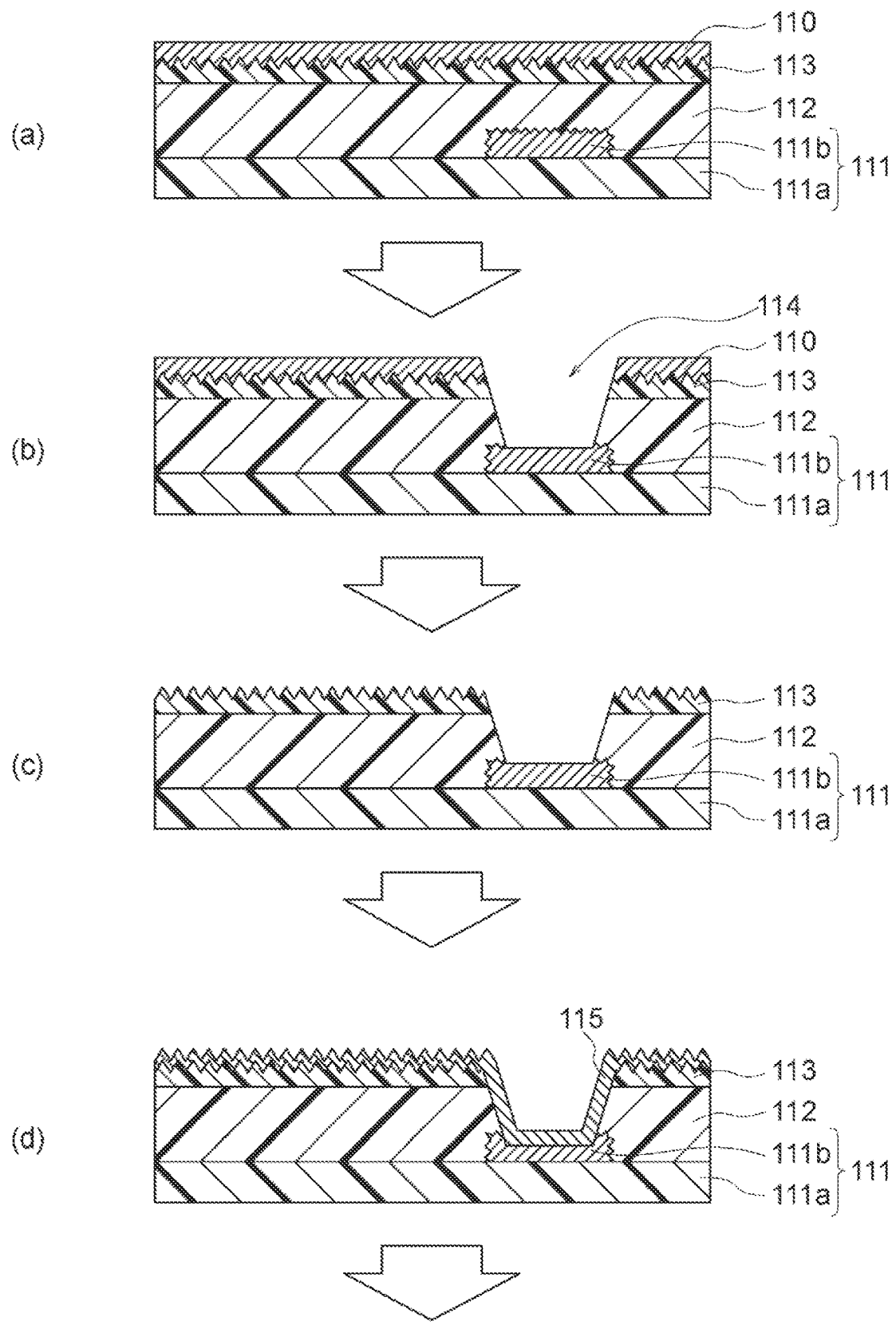
FIG. 10 is a process flow diagram for explaining an SAP and is a diagram showing the first-half steps (step (a) to step (d)).
Figure 11:
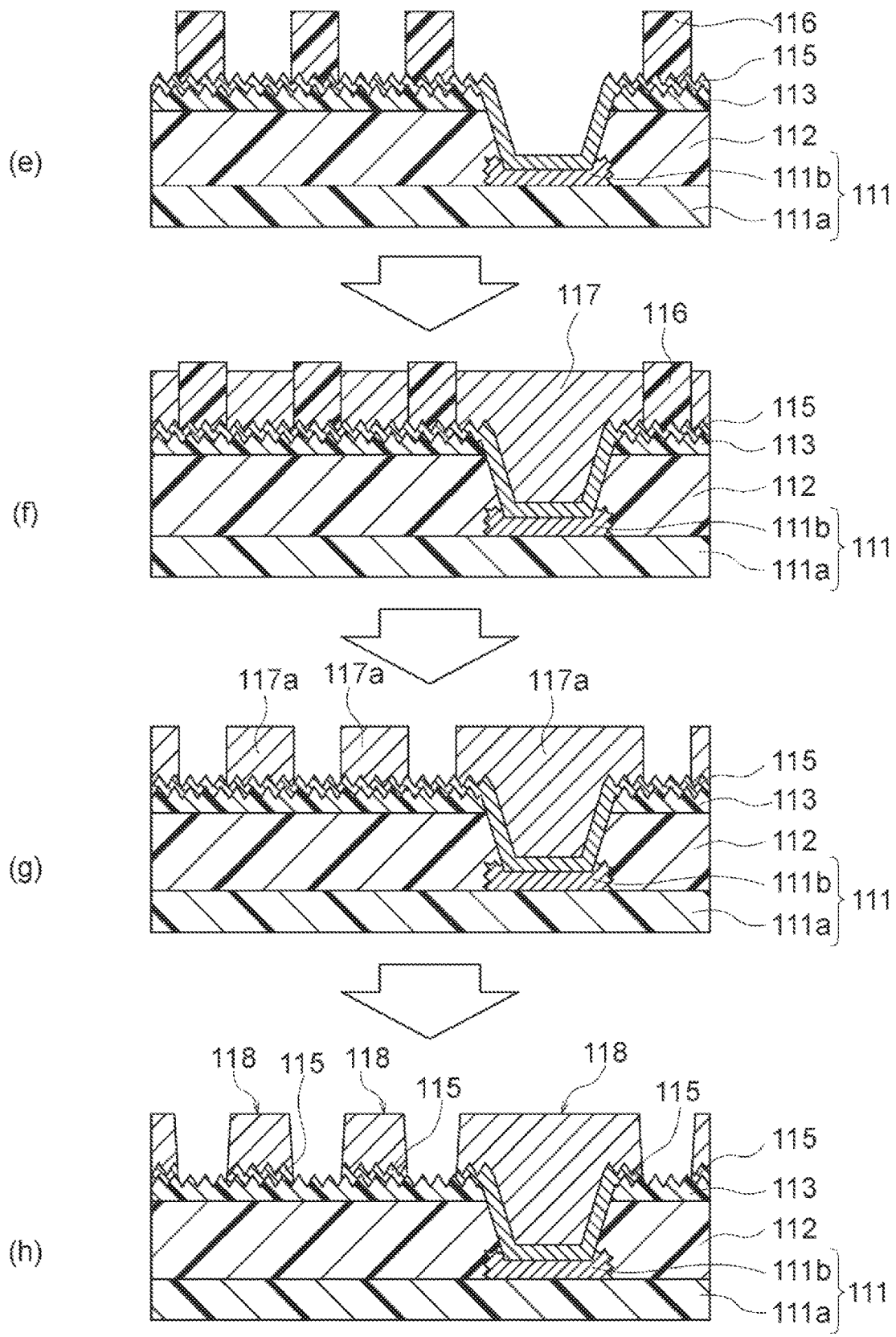
FIG. 11 is a process flow diagram for explaining the SAP and is a diagram showing the second-half steps (step (e) to step (h)).

"Valley portion void volume Vvv" herein is a parameter that represents the volume of the space of a protruding valley portion measured in accordance with ISO 25178. Vvv represents the volume of a space portion calculated from a load curve from a load area ratio Smr2 to a load area ratio of 100%, as shown in FIG. 9. The valley portion void volume Vvv can be calculated by measuring the surface profile of a predetermined measurement area (for example, a two-dimensional region of 6811.801 μm$^2$) on a roughened surface by a commercially available laser microscope. The valley portion void volume Vvv is calculated herein by specifying the load area ratio that separates a protruding valley portion and a core portion, Smr2, at 80%.

Method for Manufacturing Printed Wiring Board

The present invention relates to a method for manufacturing a printed wiring board. The method of the present invention includes the steps of (a) the preparation of an insulating substrate, (b) the formation of an electroless plating layer, (c) the lamination of a photoresist, (d) the formation of a resist pattern, (e) the formation of an electroplating layer, (f) the stripping of the resist pattern, and (g) the formation of a wiring pattern.

Each of steps (a) to (g) will be described below with reference to FIGS. 1 to 5.

(a) Preparation of Insulating Substrate

As shown in FIG. 1(a), an insulating substrate 20 including a roughened surface 20a is prepared. The insulating substrate 20 may have the roughened surfaces 20a on both sides or may have the roughened surface 20a only on one side. The insulating substrate 20 preferably includes an insulating resin. The insulating substrate 20 is preferably a prepreg and/or a resin sheet. A prepreg is a generic term for a composite material obtained by impregnating a substrate such as a synthetic resin plate, a glass plate, a glass woven fabric, a glass nonwoven fabric, or paper with a synthetic resin. Preferred examples of the insulating resin impregnated into the prepreg include epoxy resins, cyanate resins, bismaleimide triazine resins (BT resins), polyphenylene ether resins, and phenolic resins. Examples of the insulating resin constituting the resin sheet include insulating resins such as epoxy resins, polyimide resins, and polyester resins. Filler particles composed of various inorganic particles such as silica and alumina, and the like may be contained in the insulating substrate 20 from the viewpoint of improving insulating properties, and the like. The thickness of the insulating substrate 20 is not particularly limited but is preferably 1 μm or more and 1000 μm or less, more preferably 2 μm or more and 400 μm or less, and further preferably 3 μm or more and 200 μm or less. The insulating substrate 20 may be composed of a plurality of layers.

The roughened surface 20a of the insulating substrate 20 may be formed by any method but is typically formed by transferring the uneven shape of the treated surface of a surface-treated copper foil to an insulating substrate 20 surface. According to a preferred aspect of the present invention, the formation of the roughened surface 20a using a surface-treated copper foil is performed by (a-1) providing a surface-treated copper foil having a predetermined treated surface, (a-2) laminating an insulating substrate on the treated surface of the surface-treated copper foil to transfer the surface profile of the treated surface to a surface of the insulating substrate, and then (a-3) etching away the surface-treated copper foil to obtain an insulating substrate including a roughened surface. The specific procedures of the steps are as follows.

(a-1) Provision of Surface-Treated Copper Foil

Figure 3:
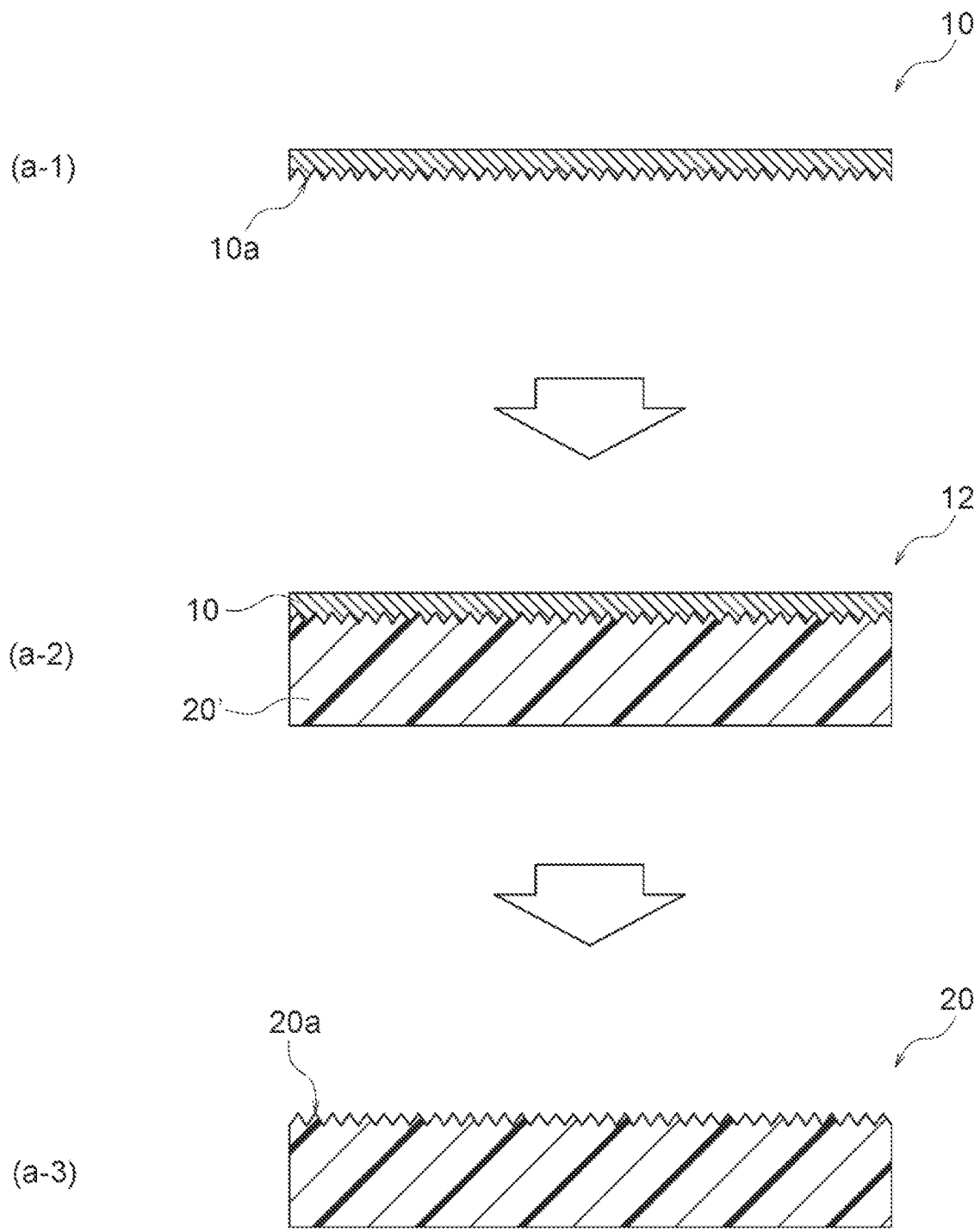
FIG. 3 is a process flow diagram showing one example of a procedure for preparing an insulating substrate including a roughened surface.

As shown in FIG. 3(a-1), a surface-treated copper foil 10 having a treated surface 10a on at least one side is provided. The treated surface 10a is a surface subjected to some surface treatment, typically a roughening-treated surface. The treated surface 10a typically includes a plurality of nodules (for example, roughening particles). In any case, the surface-treated copper foil 10 may have the treated surfaces 10a on both sides or may have the treated surface 10a only on one side. When the surface-treated copper foil has the treated surfaces 10a on both sides, the surface on the laser irradiation side (the surface opposite to the surface to be adhered to an insulating substrate) is also surface-treated when the surface-treated copper foil is used in an SAP. Therefore, the laser absorption properties increase, and as a result, the laser drilling properties can also be improved. The surface-treated copper foil 10 may be in the form of a carrier-attached copper foil. In this case, the carrier-attached copper foil typically includes a carrier, a release layer provided on this carrier, and the surface-treated copper foil 10 provided on this release layer with the treated surface 10a outside. However, in the carrier-attached copper foil, a known layer configuration can be adopted except that the surface-treated copper foil 10 is used.

The treated surface 10a of the surface-treated copper foil 10 preferably has an arithmetic mean waviness Wa of 0.20 μm or more and 0.35 μm or less, more preferably 0.25 μm or more and 0.32 μm or less. In addition, the treated surface 10a of the surface-treated copper foil 10 preferably has a maximum height Sz of 3.0 μm or more and 4.0 μm or less, more preferably 3.1 μm or more and 3.9 μm or less. Further, the treated surface 10a of the surface-treated copper foil 10 preferably has a valley portion void volume Vvv of 0.030 $\mu m^3/\mu m^2$ or more and 0.050 $\mu m^3/\mu m^2$ or less, more preferably 0.035 $\mu m^3/\mu m^2$ or more and 0.045 $\mu m^3/\mu m^2$ or less. It can be said that the treated surface 10a having such surface parameters has a shape having large waviness and small nodules (for example, roughening particles). By providing the insulating substrate 20 with an uneven shape using the surface-treated copper foil 10 having such a treated surface 10a, an electroless plating layer 22 having specific surface parameters described later is easily formed on the roughened surface 20a of the insulating substrate 20. The treated surface 10a having the above surface parameters can be formed by subjecting a copper foil surface to surface treatment (typically roughening treatment) under known or desired conditions. A commercially available copper foil having the treated surface 10a satisfying the above conditions may be selectively obtained.

(a-2) Transfer of Uneven Shape to Insulating Substrate

As shown in FIG. 3(a-2), an insulating substrate 20' (that is, the insulating substrate 20 on which the roughened surface 20a is not formed) is laminated on the treated surface 10a of the surface-treated copper foil 10 to form a copper-clad laminate 12. Thus, the surface profile of the treated surface 10a can be transferred to a surface of the insulating substrate 20'. The lamination of the insulating substrate 20' preferably involves hot pressing, and the processing temperature and processing time of this hot pressing can be appropriately determined based on known conditions according to the type and the like of the laminated insulating substrate 20'. A preferred type and the like of the insulating substrate 20' are as described above regarding the insulating substrate 20. The insulating substrate 20' may be laminated on the surface-treated copper foil 10 via a primer layer (not shown) previously applied to the treated surface 10a of the surface-treated copper foil 10. In this case, the primer layer is considered to constitute part of the insulating substrate. The primer layer is preferably composed of a resin, and this resin preferably includes an insulating resin. Via holes (not shown) may be formed in the copper-clad laminate 12 by laser drilling as desired, prior to the removal of the surface-treated copper foil 10, the next step.

(a-3) Removal of Surface-Treated Copper Foil

As shown in FIG. 3(a-3), the surface-treated copper foil 10 of the copper-clad laminate 12 is etched away to obtain the insulating substrate 20 including the roughened surface 20a. The etching of the surface-treated copper foil 10 should be performed according to an etching method and etching conditions generally used for the manufacture of a printed wiring board, using, for example, a sulfuric acid-hydrogen peroxide-based etchant, and is not particularly limited.

(b) Formation of Electroless Plating Layer

As shown in FIG. 1(b), electroless plating (for example, electroless copper plating) is performed on the roughened surface 20a of the insulating substrate 20 to form the electroless plating layer 22 less than 1.0 μm thick. The electroless plating should be performed according to a method and conditions generally used for the manufacture of a printed wiring board, using a commercially available electroless plating solution, and is not particularly limited. The electroless plating layer 22 surface has an arithmetic mean waviness Wa of 0.10 µm or more and 0.25 µm or less and a valley portion void volume Vvv of 0.010 µm$^3$/µm$^2$ or more and 0.028 µm$^3$/µm$^2$ or less. By applying electroless plating to the insulating substrate 20 including the roughened surface 20a to form the electroless plating layer 22 less than 1.0 µm thick having the predetermined surface parameters, in this manner, it is possible to provide a method for manufacturing a printed wiring board that effectively suppresses pattern failure and is also excellent in fine circuit forming properties.

As described above, with further miniaturization of a circuit required for the SAP in recent years, it is considered to provide an insulating substrate with a roughened surface profile by use of a copper foil whose surface is smooth with small roughening particles, in order to achieve excellent etchability. In addition, it is convenient if electroless plating can be thinly (for example, less than 1.0 µm) applied to the surface of the insulating substrate provided with the roughened surface profile, because the amount of etching can be reduced to promote further miniaturization of a circuit. However, it has been found that the SAP, where a copper foil whose surface is smooth with small roughening particles is used and electroless plating is thinly applied to attempt circuit formation, may cause a problem of pattern failure such as the occurrence of a short circuit or raised portions in the formed circuit. The mechanism by which this pattern failure occurs is not necessarily certain but is inferred as follows.

Figure 4:
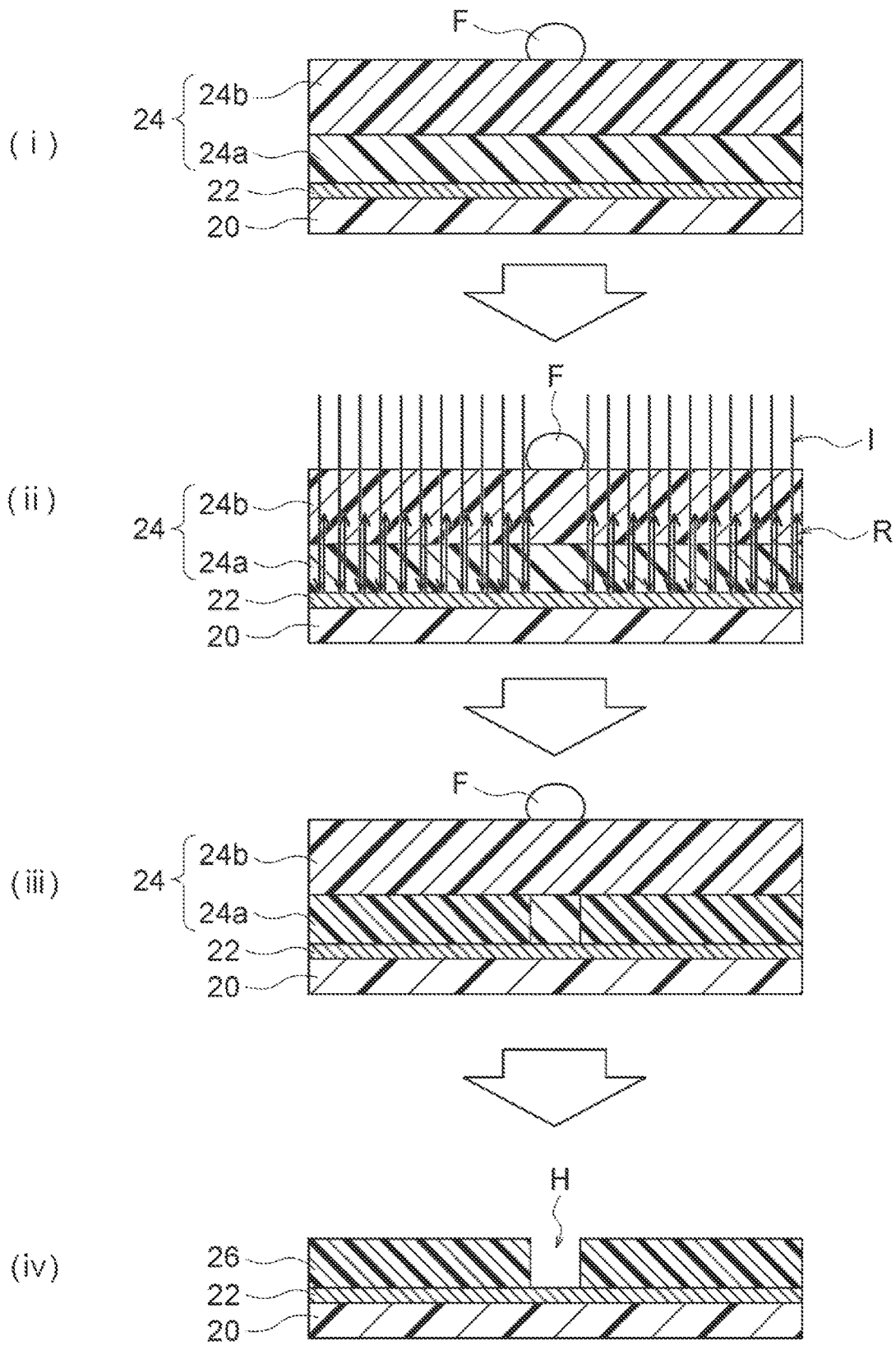
FIG. 4 is a diagram for explaining the influence of a surface foreign material during exposure and development when there is no sufficient uneven shape on a surface after electroless plating.
Figure 5:
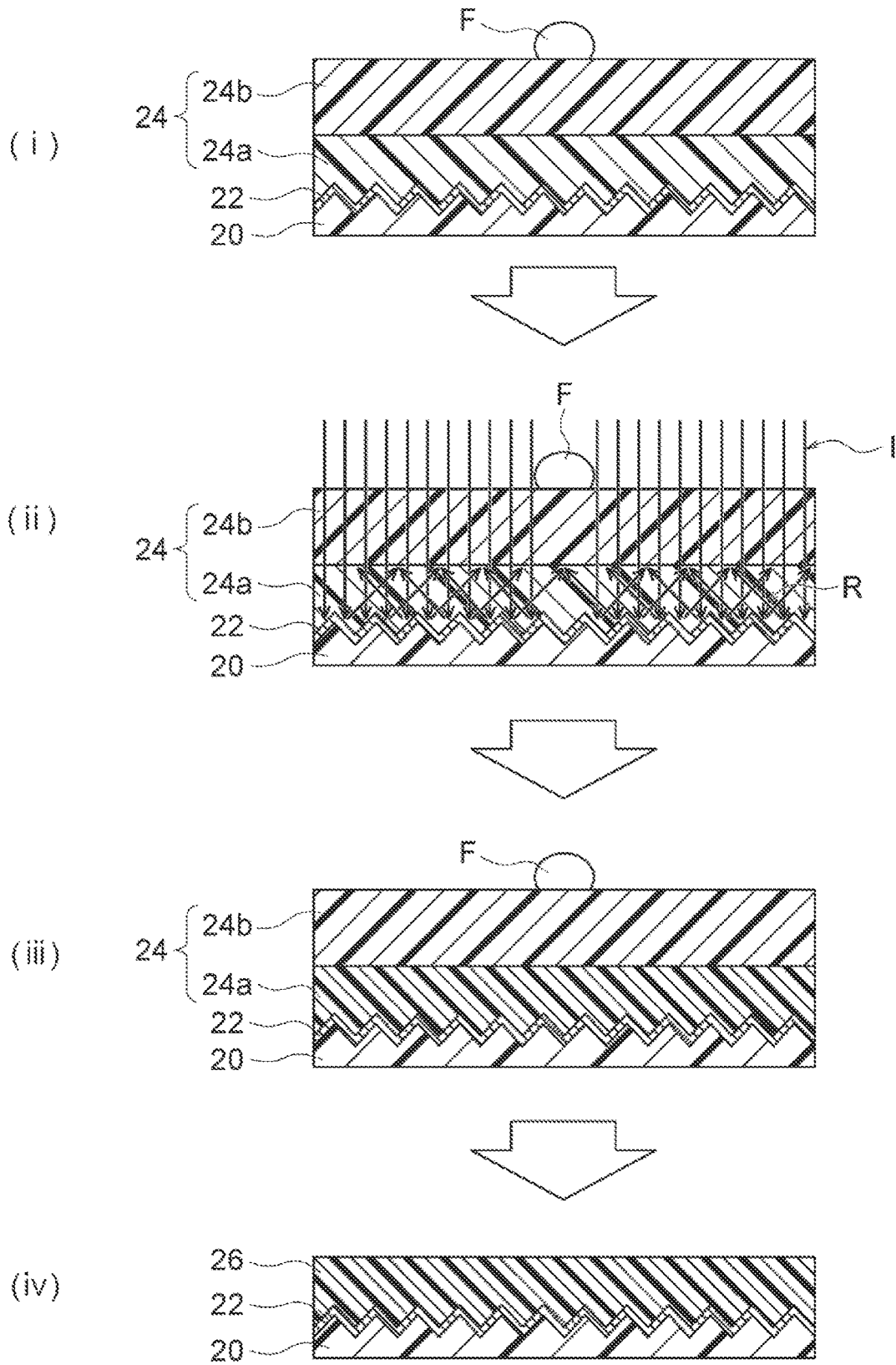
FIG. 5 is a diagram for explaining the influence of a surface foreign material during exposure and development when there is a sufficient uneven shape on a surface after electroless plating.

When a surface profile is transferred to an insulating substrate using a surface-treated copper foil, the roughened surface of the insulating substrate generally reflects the surface profile of the surface-treated copper foil. When electroless plating is applied to the roughened surface of this insulating substrate with a thinness of less than 1.0 µm, the surface profile of the electroless plating layer generally reflects the surface profile of the roughened surface of the insulating substrate. Therefore, it can be said that when a copper foil whose surface is smooth with small roughening particles (in other words, a copper foil having a fine uneven shape) is used as a copper foil used for transferring a surface profile to an insulating substrate, the surface of an electroless plating layer is less likely to be provided with a sufficient uneven shape. In a general process for manufacturing a printed wiring board, in order to form a circuit in a predetermined pattern, a photoresist 24 (including, for example, a dry film resist 24a and a supporting film 24b) is further laminated on the surface of an electroless plating layer 22 laminated on an insulating substrate 20, and exposure and development are performed to form a resist pattern 26, as shown in FIGS. 4(i) to 4(iv). Here, as shown in FIG. 4(i), during the lamination of the photoresist 24 or during exposure, a foreign material F (including, for example, a mote or a scratch on the photoresist surface, and air trapping during photoresist lamination) can adhere to or get into the surface of the photoresist 24. In this respect, when exposure is performed on the photoresist 24 laminated on the electroless plating layer 22 surface not provided with a sufficient uneven shape, exposure incident light I that enters from the direction perpendicular to a major surface of the laminate is reflected by the electroless plating layer 22 as it is, and exits as exposure reflected light R in the direction 180° opposite to the exposure incident light I, as shown in FIG. 4(ii). Therefore, the portion of the photoresist 24 (for example, the dry film resist 24a) directly under the foreign material F that ought to be essentially exposed remains unexposed (see FIG. 4(iii)), and a hole H is formed after development (see FIG. 4(iv)). It is considered that as a result, electroplating is applied to a place where a circuit ought not to be essentially formed, and this unnecessary electroplating portion causes the short circuit or the raised portion in the circuit described above, and the problem of pattern failure arises.

The present inventors have paid attention to such a point and studied the relationship between an electroless plating layer surface and an unexposed portion due to a foreign material, and the relationship between an electroless plating layer surface and fine circuit forming properties. As a result, the present inventors have found out that when the arithmetic mean waviness Wa and the valley portion void volume Vvv on the surface of an electroless plating layer are 0.10 µm or more and 0.25 µm or less and 0.010 µm$^3$/µm$^2$ or more and 0.028 µm$^3$/µm$^2$ or less, respectively, pattern failure is effectively suppressed, and a fine circuit can be well formed. Thus, the present inventors have arrived at the present invention. Such suppression of pattern failure and excellent fine circuit forming properties are considered to be achieved as follows. By setting the arithmetic mean waviness Wa on an electroless plating layer 22 surface at 0.10 µm or more, and setting the valley portion void volume Vvv at 0.010 µm$^3$/µm$^2$ or more, the electroless plating layer 22 surface has a sufficient uneven shape (see FIG. 5(i)). Therefore, when exposure incident light I that enters from the direction perpendicular to a major surface of the laminate reaches the electroless plating layer 22 surface during exposure, the exposure incident light I reflects diffusely due to the waviness of the electroless plating layer 22 surface (see FIG. 5(ii)). In addition, when the exposure incident light I enters deeply into the valleys of the unevenness of the electroless plating layer 22 surface, strong light is less likely to return, but by setting the valley portion void volume Vvv on the electroless plating layer 22 surface at 0.028 µm$^3$/µm$^2$ or less, the valleys of the unevenness of the electroless plating layer 22 surface are shallow. Therefore, the exposure incident light I can reflect diffusely in portions where the valleys of the electroless plating layer 22 surface are shallow, and the light intensity of exposure reflected light R is kept strong. In other words, it can also be said that the electroless plating layer 22 having the above parameters has a surface having large waviness and shallow valleys (no large holes), and therefore the exposure incident light I can be diffusely reflected with strong light intensity. As a result, the portion of a photoresist 24 (for example, a dry film resist 24a) directly under a foreign material F can be effectively exposed to the exposure reflected light R. In this manner, the formation of an unexposed portion of the photoresist 24 due to the foreign material F is effectively prevented (see FIG. 5(iii)), and the formation of an unnecessary hole H by development is suppressed (see FIG. 5(iv)). Thus, it is considered that the problem of pattern failure such as the occurrence of a short circuit or raised portions in a circuit is less likely to arise. On the other hand, it can be said that when the electroless plating layer 22 surface has a coarse unevenness shape, the etchability for the electroless plating layer 22 is likely to decrease. In this respect, it is considered that by thinly forming the electroless plating layer 22 with a thickness of less than 1.0 μm, and setting the arithmetic mean waviness Wa of the electroless plating layer 22 surface at 0.25 μm or less, good etchability for the electroless plating layer 22 can be ensured, and the fine circuit forming properties can also be improved.

From the above viewpoint, the surface of the electroless plating layer 22 has an arithmetic mean waviness Wa of 0.10 μm or more and 0.25 μm or less, preferably 0.20 μm or more and 0.25 μm or less. The surface of the electroless plating layer 22 has a valley portion void volume Vvv of 0.010 $\mu m^3/\mu m^2$ or more and 0.028 $\mu m^3/\mu m^2$ or less, preferably 0.017 $\mu m^3/\mu m^2$ or more and 0.025 $\mu m^3/\mu m^2$ or less.

The surface of the electroless plating layer 22 preferably has a kurtosis Sku of 2.0 or more and 3.5 or less, more preferably 3.0 or more and 3.5 or less. Thus, the sharpness of the valleys of the unevenness of the electroless plating layer 22 surface is suppressed, and as a result, the light intensity of the exposure reflected light R can be kept in an even stronger state, and the fine circuit forming properties can also be even more improved.

The electroless plating layer 22 having the above specific surface parameters can be formed by applying electroless plating on the roughened surface 20a of the insulating substrate 20 with a thinness of less than 1.0 μm. As described above, it can be said that the surface profile of the electroless plating layer 22 generally reflects the surface profile of the roughened surface 20a of the insulating substrate 20. This roughened surface 20a can be preferably formed, for example, by transferring the surface profile of the surface-treated copper foil 10 having the surface parameters described in the above (a) to the insulating substrate 20.

The thickness of the electroless plating layer 22 is less than 1.0 μm, preferably 0.3 μm or more and less than 1.0 μm. When the electroless plating layer 22 has such a thickness, the amount of etching during wiring pattern formation can be decreased, which is extremely suitable for forming a fine circuit.

(c) Lamination of Photoresist

As shown in FIG. 1(c), a photoresist 24 is laminated on the surface of the electroless plating layer 22. The lamination rate when the photoresist 24 is laminated is not particularly limited but is typically 1.0 m/minute or more and 2.0 m/minute or less. For the photoresist 24, a known material generally used for the manufacture of a printed wiring board can be used. The photoresist 24 may be either of a negative type and a positive type and may be either of a film type and a liquid type. Preferably, the photoresist 24 includes a dry film resist 24a. The photoresist 24 is preferably a photosensitive film, for example, a photosensitive dry film. As shown in FIG. 1(c), in the photoresist 24, a supporting film 24b such as a polyethylene terephthalate (PET) film may be further laminated on the dry film resist 24a as a photosensitive layer. The thickness of the photoresist 24 or the dry film resist 24a is preferably 2 μm or more and 35 μm or less, more preferably 5 μm or more and 24 μm or less.

(d) Formation of Resist Pattern

As shown in FIG. 2(d), exposure and development are performed on the photoresist 24 to form a resist pattern 26. The exposure and the development should be performed according to a known method and known conditions generally used for the manufacture of a printed wiring board and is not particularly limited. For example, as the exposure method, in addition to a mask exposure process using a negative or positive mask pattern, direct writing exposure processes such as a Laser Direct Imaging (LDI) exposure process and a Digital Light Processing (DLP) exposure process, and the like can be adopted. The amount of exposure during the exposure is preferably 5 mJ/cm² or more and 150 mJ/cm² or less. On the other hand, the development method may be either of wet development and dry development. In the case of wet development, the developer used may be a developer such as sodium carbonate, sodium hydroxide, or an amine-based aqueous solution. When the photoresist 24 includes the supporting film 24b, development is preferably performed after the supporting film 24b is removed.

(e) Formation of Electroplating Layer

Electroplating (for example, electric copper plating) is applied to the electroless plating layer 22 via the resist pattern 26. Thus, as shown in FIG. 2(e), an electroplating layer 28 can be formed between the resist patterns 26. The electroplating should be performed according to various pattern plating methods and conditions generally used for the manufacture of a printed wiring board, including, for example, a copper sulfate plating solution and a copper pyrophosphate plating solution, and is not particularly limited.

(f) Stripping of Resist Pattern

In this step, the resist pattern 26 is stripped. As a result, as shown in FIG. 2(f), the electroplating layer 28 remains in the form of a wiring pattern, and the unnecessary portions of the electroless plating layer 22 not forming the wiring pattern are exposed. For the stripping of the resist pattern 26, a sodium hydroxide aqueous solution, an amine-based solution or an aqueous solution thereof, or the like is adopted, and the stripping of the resist pattern 26 should be performed according to various stripping methods and conditions generally used for printed wiring boards and is not particularly limited.

(g) Formation of Wiring Pattern

The unnecessary portions (that is, the portions not forming the wiring pattern) of the electroless plating layer 22 exposed by the stripping of the resist pattern 26 are etched away to form a wiring pattern 30. The etching of the unnecessary portions of the electroless plating layer 22 should be performed according to an etching method and etching conditions generally used for the manufacture of a printed wiring board, using, for example, a sulfuric acid-hydrogen peroxide-based etchant, and is not particularly limited. The thickness of the wiring pattern 30 (that is, the circuit height) is preferably 2 μm or more and 30 μm or less. The wiring pitch of the wiring pattern 30 is preferably within the range of 10 μm (for example, line/space=5 μm/5 μm) to 20 μm (for example, line/space=10 μm/10 μm). By forming a circuit on the electroless plating layer 22 less than 1.0 μm thick having the predetermined surface parameters, a wiring pattern highly fine in this manner can be formed. It can be said that in the wiring pattern having a wiring pitch within the above range, the problem of pattern failure such as the occurrence of a short circuit or raised portions is likely to arise. But as described above, according to the method of the present invention, such a problem can be effectively solved.

An insulating layer and an nth wiring pattern (n is an integer of 2 or more) may be alternately formed on the wiring pattern 30 as needed, to form a multilayer wiring board. The wiring patterns constituting the multilayer wiring board can be referred to as a second wiring pattern, a third wiring pattern, . . . , and an nth wiring pattern in order, with the wiring pattern 30 being a first wiring pattern. A sequentially laminated structure composed of a first wiring pattern, an nth wiring pattern, and an insulating layer is generally referred to as a buildup layer or a buildup wiring layer. The process for the method for forming a buildup layer for second and subsequent wiring patterns is not particularly limited, and in addition to the SAP, a modified semi-additive process (MSAP), a full additive process, a subtractive process, and the like can be used. A solder resist, mounting bumps such as pillars, and the like may be formed on the wiring pattern on the outermost surface of the buildup layer as needed. In any case, a known process generally adopted for a printed wiring board can be appropriately additionally performed, which is not particularly limited.

EXAMPLES

The present invention will be more specifically described by the following examples.

Examples 1 to 6

Six types of surface-treated copper foils were provided, and using each of these surface-treated copper foils, the surface profile was transferred to an insulating substrate. Electroless plating was applied to the roughened surface of the obtained insulating substrate to fabricate an evaluation laminate, and various evaluations were performed. Specifically, the operations are as follows.

(1) Provision of Surface-Treated Copper Foils

Six types of surface-treated copper foils 10 including a treated surface 10a having parameters shown in Table 1 on at least one surface were provided. Some of these surface-treated copper foils 10 were commercially available products, and others were separately fabricated based on a known method. The methods for measuring or calculating the parameters on the treated surface 10a of each of the provided surface-treated copper foils 10 are as follows.

(Arithmetic Mean Waviness Wa)

The arithmetic mean waviness Wa of a copper foil surface was measured in accordance with JIS B0601-2001 under the conditions of a magnification of 3000×, with inclination correction, with noise removal by DCL/BCL, without cutoff, and an evaluation length of 64.124 μm using a laser microscope (manufactured by KEYENCE CORPORATION, VK-X200) and using a 150× objective lens.

(Maximum Height Sz and Valley Portion Void Volume Vvv)

The maximum height Sz and valley portion void volume Vvv of a copper foil surface were measured in accordance with ISO 25178 under the conditions of a magnification of 3000×, with waviness removal (intensity: 5), without noise removal by DCL/BCL, with cutoff by an S filter (0.25 μm) and an L filter (0.025 mm), and an evaluation region of 6811.801 μm² using a laser microscope (manufactured by KEYENCE CORPORATION, VK-X200) and using a 150× objective lens.

(2) Fabrication of Evaluation Laminate

Two prepregs (manufactured by Mitsubishi Gas Chemical Company, Inc., GHPL-830NSF, thickness: 100 μm) were laminated, and then, as shown in FIG. 3, the surface-treated copper foil 10 provided in the above (1) was laminated on this insulating substrate 20' so that the treated surface 10a abutted, and pressing was performed under the conditions of a pressing temperature of 220° C., a pressing time of 90 minutes, and a pressure of 40 kgf/cm² to obtain a copper-clad laminate 12. All the surface-treated copper foil 10 of this copper-clad laminate 12 was removed with a sulfuric acid-hydrogen peroxide-based etchant to obtain an insulating substrate 20 having a roughened surface 20a to which the surface profile of the treated surface 10a was transferred. Electroless copper plating was performed on this insulating substrate 20 using an electroless copper plating solution (manufactured by C. Uyemura & Co., Ltd., THRU-CUP PEA), to form a 0.7 μm thick electroless plating layer 22 on the roughened surface 20a side. Thus, a laminate immediately before a photoresist was laminated (hereinafter referred to as an evaluation laminate) was obtained in the SAP.

(3) Surface Profile Measurement of Evaluation Laminate

The measurement of parameters on the electroless plating layer 22 side surface of the obtained evaluation laminate was performed as follows. The results were as shown in Table 1.

(Arithmetic Mean Waviness Wa)

The arithmetic mean waviness Wa of the electroless plating layer 22 side surface of the evaluation laminate was measured in accordance with JIS B0601-2001 under the conditions of a magnification of 3000×, with inclination correction, with noise removal by DCL/BCL, without cutoff, and an evaluation length of 64.124 μm using a laser microscope (manufactured by KEYENCE CORPORATION, VK-X200) and using a 150× objective lens.

(Kurtosis Sku and Valley Portion Void Volume Vvv)

The kurtosis Sku and valley portion void volume Vvv of the electroless plating layer 22 side surface of the evaluation laminate were measured in accordance with ISO 25178 under the conditions of a magnification of 3000×, with waviness removal (intensity: 5), without noise removal by DCL/BCL, with cutoff by an S filter (0.25 μm) and an L filter (0.025 mm), and an evaluation region of 6811.801 μm² using a laser microscope (manufactured by KEYENCE CORPORATION, VK-X200) and using a 150× objective lens.

(4) Evaluation of Evaluation Laminate

For the obtained evaluation laminate, the evaluation of various characteristics was performed as follows.

<Number of Motes Detected>

Figure 6:
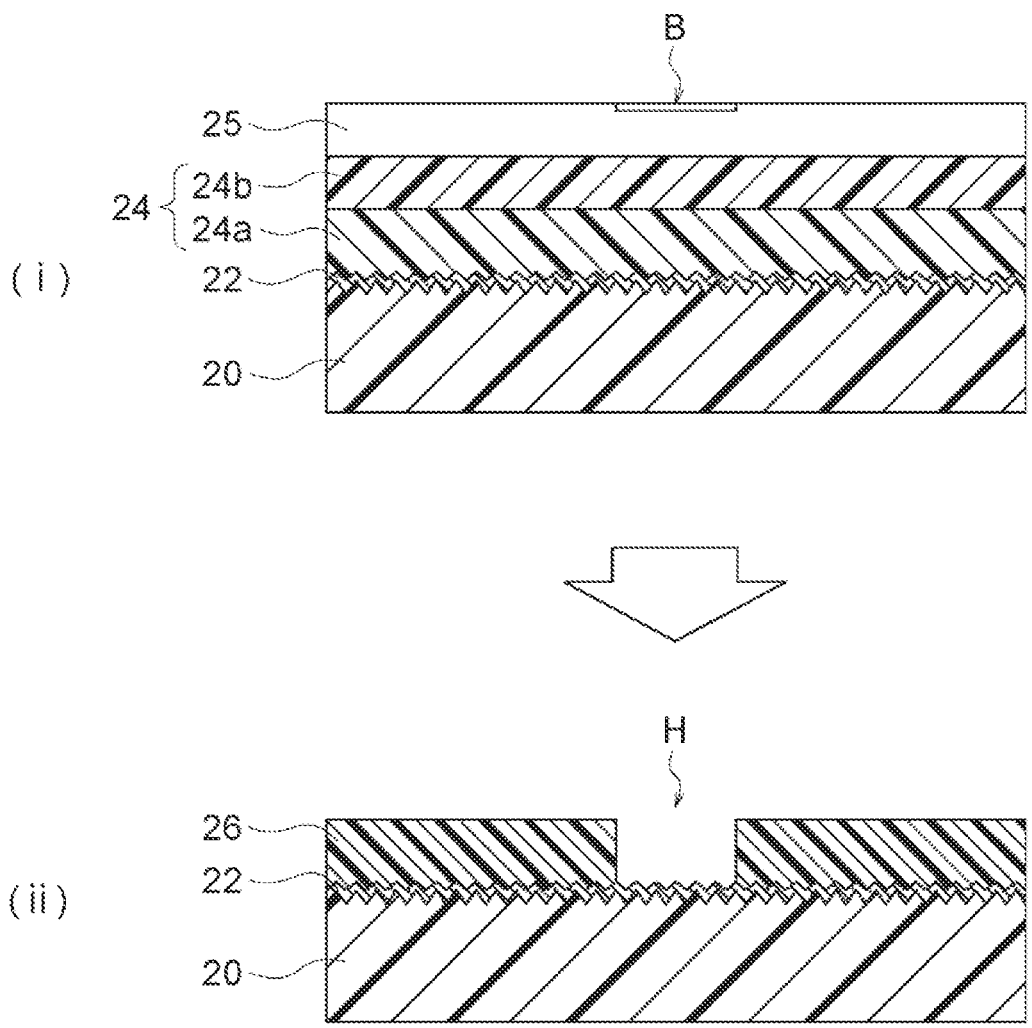
FIG. 6 is a diagram for explaining a procedure for the evaluation of the number of motes detected in Examples.

The evaluation of the number of motes detected was performed as follows. First, a 19 μm thick negative type photoresist 24 (manufactured by Hitachi Chemical Company, Ltd., RY-5319) was laminated on the electroless plating layer 22 side surface of the obtained evaluation laminate at a lamination rate of 1.5 m/minute, and then a glass mask 25 was laid on the surface of the photoresist 24, as shown in FIG. 6(i). In the glass mask 25, circular light-blocking portions B (diameter: 6 μm, 7 μm, 8 μm, or 9 μm, 200 each) based on the assumption of foreign materials such as motes are provided in the central portions of regions partitioned with 100 μm×100 μm. Therefore, light passes through the portions of the glass mask 25 where the light-blocking portions B are not provided, and on the other hand, light does not pass through the portions of the glass mask 25 where the light-blocking portions B are provided. Exposure (70 mJ/cm²) was performed on the evaluation laminate on which the glass mask 25 was laid, and then development was performed on the evaluation laminate to form a resist pattern 26. The surface of the evaluation laminate on the resist pattern 26 side after the development was observed by a digital microscope (manufactured by Olympus Corporation, DSX510) under the condition of a magnification of 50×, and the number of holes H formed in the resist pattern 26, as shown in FIG. 6(*ii*), was counted as the number of motes detected. The results were as shown in Table 1. It can be said that as the number of motes detected becomes larger (that is, the resolution becomes better), the possibility that unnecessary electroplating is applied to places where a circuit ought not to be essentially formed becomes higher, and pattern failure becomes more likely to occur.

<Circuit Forming Properties>

Figure 1:
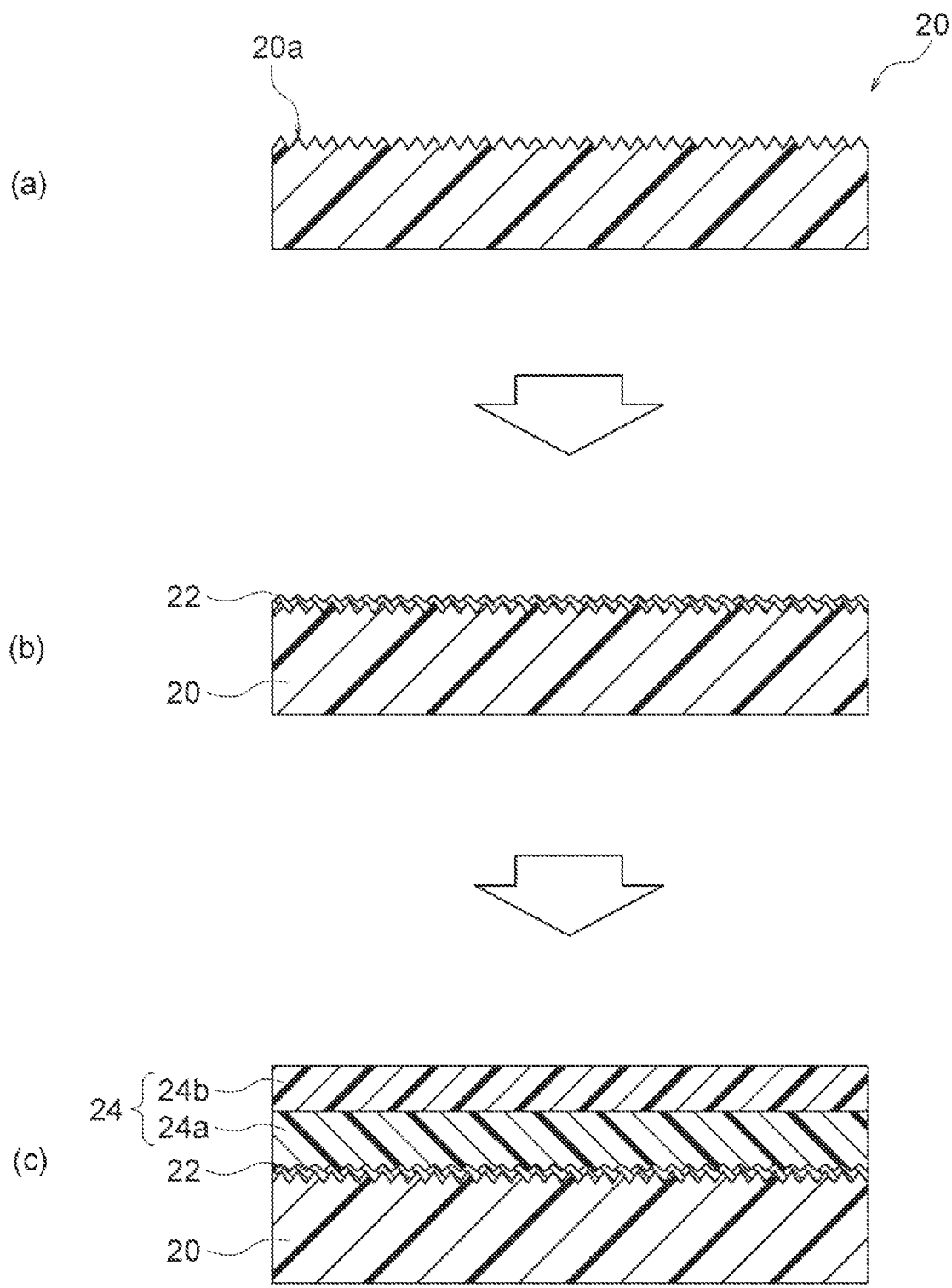
FIG. 1 is a process flow diagram showing the first-half steps (steps (a) to (c)) in one example of the manufacturing method of the present invention.
Figure 2:
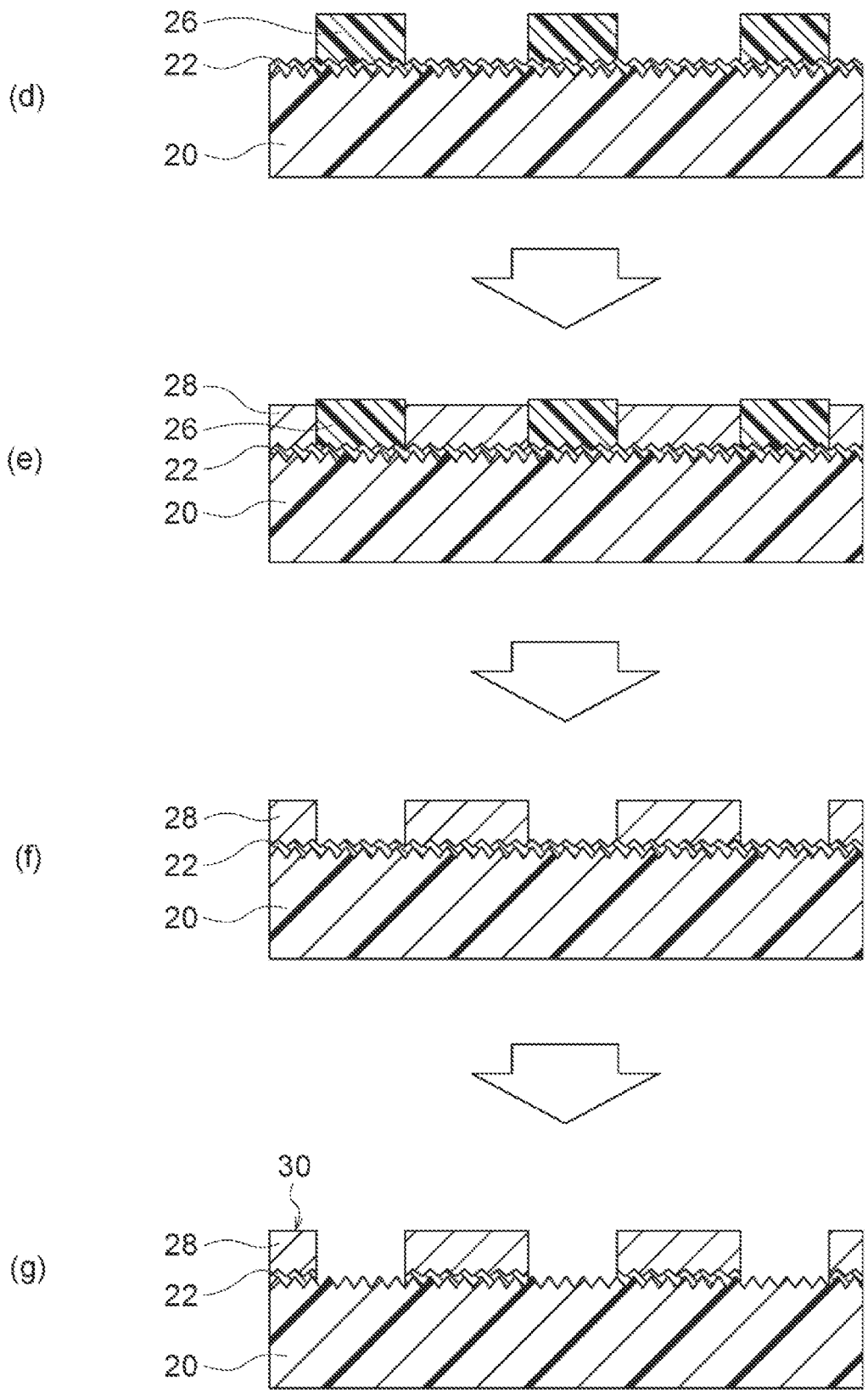
FIG. 2 is a process flow diagram showing the second-half steps (steps (d) to (g)) in one example of the manufacturing method of the present invention.

The evaluation of circuit forming properties was performed as follows. As shown in FIG. 1, a 15 μm thick negative type photoresist 24 (manufactured by Asahi Kasei Corporation, UFG-155) was laminated on the electroless plating layer 22 side surface of the obtained evaluation laminate at a lamination rate of 1.5 m/minute, and then a mask with line/space (L/S)=9 μm/6 μm was laid on the photoresist 24 so that the intended circuit width was 7 μm. As shown in FIG. 2, exposure (70 mJ/cm$^2$) was performed on the evaluation laminate on which the mask was laid, and then development was performed on the evaluation laminate to form a resist pattern 26. Electric copper plating was performed on the evaluation laminate after the formation of the resist pattern 26 under known conditions to form an electroplating layer 28 between the resist patterns 26. The resist pattern 26 was stripped from the evaluation laminate after the formation of the electroplating layer 28, and the unnecessary portions of the electroless plating layer 22 thus exposed were etched away using a sulfuric acid-hydrogen peroxide-based etchant, to form a wiring pattern 30 having a circuit height of 11 μm. For the amount of etching at this time, the etching rate of the electroless plating layer 22 was previously measured, and etching was performed under the conditions of so-called overetching by which a so-called just etching (corresponding to 0.7 μm) plus an amount corresponding to 0.3 μm was etched. The circuit width of the wiring pattern 30 thus obtained was observed by an SEM under the condition of a magnification of 5000×. This circuit width was determined by measuring the circuit top width of the wiring pattern 30 in one field of view of the SEM at 10 points at intervals of 1 μm and calculating the average value. The obtained circuit width was evaluated according to the following criteria. The results were as shown in Table 1.

Evaluation A: 6.6 μm or more
Evaluation B: 5.6 μm or more and less than 6.6 μm
Evaluation C: 4.6 μm or more and less than 5.6 μm
Evaluation D: less than 4.6 μm

TABLE 1

| | Surface property parameters | | | | | Evaluation | | | | |
| | Parameters of electroless plating surface | | | Parameters of copper foil surface | | | Number of motes detected on dry film | | | | Circuit forming properties |
| | Wa (μm) | Sku | Vvv (μm$^3$/μm$^2$) | Wa (μm) | Sz (μm) | Vvv (μm$^3$/μm$^2$) | 6 μm | 7 μm | 8 μm | 9 μm | |
|---|---|---|---|---|---|---|---|---|---|---|---|
| Ex. 1 | 0.13 | 3.16 | 0.015 | 0.24 | 3.14 | 0.030 | 0 | 0 | 20 | 136 | B |
| Ex. 2 | 0.15 | 2.89 | 0.019 | 0.23 | 3.27 | 0.040 | 0 | 0 | 15 | 120 | B |
| Ex. 3 | 0.23 | 3.28 | 0.023 | 0.31 | 3.37 | 0.040 | 0 | 0 | 7 | 103 | B |
| Ex. 4* | 0.22 | 3.65 | 0.030 | 0.57 | 5.90 | 0.070 | 1 | 20 | 140 | 190 | C |
| Ex. 5* | 0.07 | 5.24 | 0.010 | 0.13 | 2.41 | 0.020 | 0 | 43 | 142 | 192 | A |
| Ex. 6* | 0.50 | 2.83 | 0.066 | 0.48 | 3.88 | 0.050 | 0 | 0 | 0 | 0 | D |

*represents a Comparative Example.

The invention claimed is:

1. A method for manufacturing a printed wiring board, comprising:
   (a) providing an insulating substrate comprising a roughened surface;
   (b) performing electroless plating on the roughened surface of the insulating substrate to form an electroless plating layer less than 1.0 μm thick having a surface having an arithmetic mean waviness Wa of 0.10 μm or more and 0.25 μm or less as measured in accordance with JIS B0601-2001 and a valley portion void volume Vvv of 0.010 μm$^3$/μm$^2$ or more and 0.028 μm$^3$/μm$^2$ or less as measured in accordance with ISO 25178;
   (c) laminating a photoresist on the surface of the electroless plating layer;
   (d) performing exposure and development on the photoresist to form a resist pattern;
   (e) applying electroplating to the electroless plating layer via the resist pattern;
   (f) stripping the resist pattern; and
   (g) etching away an unnecessary portion of the electroless plating layer exposed by stripping of the resist pattern, to form a wiring pattern,
   wherein (a) comprises:
   (a-1) providing a surface-treated copper foil having a treated surface having an arithmetic mean waviness Wa of 0.20 μm or more and 0.35 μm or less as measured in accordance with JIS B0601-2001 and a valley portion void volume Vvv of 0.030 μm$^3$/μm$^2$ or more and 0.050 μm$^3$/μm$^2$ or less as measured in accordance with ISO 25178,
   (a-2) laminating an insulating substrate on the treated surface of the surface-treated copper foil to transfer a surface profile of the treated surface to a surface of the insulating substrate, and then
   (a-3) etching away the surface-treated copper foil to obtain the insulating substrate comprising the roughened surface.

2. The method according to claim 1, wherein the arithmetic mean waviness Wa on the surface of the electroless plating layer is 0.20 μm or more and 0.25 μm or less.

3. The method according to claim 1, wherein the valley portion void volume Vvv on the surface of the electroless plating layer is 0.017 μm$^3$/μm$^2$ or more and 0.025 μm$^3$/μm$^2$ or less.

4. The method according to claim 1, wherein the electroless plating layer has a thickness of 0.3 μm or more and less than 1.0 μm.

5. The method according to claim 1, wherein the photoresist comprises a dry film resist.

6. The method according to claim 5, wherein the dry film resist has a thickness of 2 μm or more and 35 μm or less.

7. The method according to claim 1, wherein the wiring pattern has a thickness of 2 μm or more and 30 μm or less.

* * * * *